Feb. 9, 1971 J. E. VANDER MEY 3,562,117

METHOD OF COPPER ELECTROPLATING PRINTED CIRCUIT BOARDS

Filed Sept. 18, 1967

INVENTOR.
JOHN E. VANDER MEY

BY Gerard P. Rooney

ATTORNEY

United States Patent Office 3,562,117
Patented Feb. 9, 1971

3,562,117
METHOD OF COPPER ELECTROPLATING PRINTED CIRCUIT BOARDS

John E. Vander Mey, Stirling, N.J., assignor to Allied Chemical Corporation, New York, N.Y., a corporation of New York Filed Sept. 18, 1967, Ser. No. 668,551
Int. Cl. C23b *5/20*
U.S. Cl. 204—24 5 Claims

ABSTRACT OF THE DISCLOSURE

A copper plating bath composition comprising a mixture of a copper salt and fluoboric acid, each being present in an amount, which upon dissolution in an aqueous bath provides a copper concentration from 5 and 35 grams per liter and from 100 to 700 grams per liter of fluoboric acid. The plating baths of the present invention have particular efficacy in the copper plating of recessed areas, such as perforated substrates for use as printed circuit boards.

The present invention relates to a composition comprising a mixture of a copper salt and fluoboric acid. More particularly, the present invention relates to an aqueous bath composition comprising a mixture of a copper salt and fluoboric acid. Specifically, the present invention relates to a copper plating bath designed especially for the copper plating of printed circuit boards.

Printed circuits are now used in practically all types of electrical and electronic equipment, including for example, radio, television, electronic computers, hearing aids, timing devices, test instruments and industrial controlled circuits. These printed circuits usually include one or more printed circuit boards. Each board usually has a plastic insulating base, having perforations or holes at predetermined spaced locations that extend from one surface of the base to the other, and a pattern of copper conductors disposed on one surface of the base. Some of the conductors in the pattern are disposed about the holes for soldered connection to circuit component leads that are inserted in the holes, and these conductors are usually referred to as "lands." Other conductors provide contact pads; and still others provide interconnecting paths or highways between lands and between lands and contact pads. Circuit components, such as capacitors, resistors, and transistors, are mounted on a surface of the board opposite the surface on which the pattern of copper conductors is disposed and these circuit components have their leads or pins inserted and physically secured in the holes, and electrically connected to the lands by solder. Frequently, the contact pads are provided by solid plugs that extend from one surface of the insulated base to the other, while the lands and interconnection paths usually are formed on one surface of the insulated base by etching or dissolving the undesired part of the copper deposit that is disposed on the surface of the base. The circuit components are secured to the base by their leads which have been inserted in the holes, the leads being soldered to the lands, usually by dip soldering.

As can be appreciated, the hole surfaces and the exposed conducting portion of the printed circuit boards must be properly plated with the copper in order for the printed circuit board to be effectively used. The substrates which are usually non-conductive are first rendered conductive by coating the substrate surface either with a copper foil laminate or by plating the substrate surface with copper, such as from an electroless plating bath. The insulated base is then sufficiently conductive to be plated by the bath composition of the present invention. Generally, the plating of the insulated base is continued until the hole surfaces of the base have a copper coating on the inside of the hole of a thickness of approximately 1 mil (0.001 inch), which is generally adequate for most circuit applications. For heavier current carrying capacity, greater thicknesses are employed. In service, the copper plate in the holes of the printed circuit wiring board having external components assembled on it with component terminals inserted in the plated hole, is subject to mechanical shock and possibly rupture due to the creation of the leverage action of the component lead, which, during operation, is subject to mechanical vibration, which in turn is transmitted through the terminal inserted in the plated hole. Also, a properly plated circuit hole is required to achieve a satisfactory current carrying capacity and permit a more reliable component connection by dip soldering without unduly restrictive control conditions. Thus, it is necessary, in order to avoid defective printed circuit boards to achieve an even ductile, shock resistant, copper plate deposit over the entire circuit board, including the hole surfaces.

It is known to produce acceptable copper plate deposits which are adherent and smooth with the use of organic or inorganic addition agents. When exacting requirements for brightness, leveling, absence of pores, and ductility of the deposit have to be met, it was necessary heretofore to employ at least two, and usually three or more different addition agents in an aqueous electrolytic copper bath consisting otherwise of an ionized copper salt and a sufficient amount of an acid or acid salt to make the solution conductive. However, electrolytic copper plating baths, including such proposed additives, do not have the required degree of throwing power which is demanded in the copper plating of printed circuit boards. By "throwing power" it is meant the ability of the copper plate to form a smooth and adherent coating of copper on a substrate having recessed areas, such as in the through hole plating of printed circuit boards. In relation to printed circuit boards, "throw power" can be defined as the ratio between the weight of deposit on a high current density area, i.e., board area, in comparison to the weight of deposit on a low current density area, i.e., hole area.

Typically, the electrodeposition of copper from an aqueous bath has been previously accomplished with either a copper pyrophosphate, copper sulfate, or copper fluoborate plating bath. While copper sulfate and copper fluoborate plating baths have been used previously in the preparation of printed circuit boards, they have been substantially replaced by the copper pyrophosphate plating baths, the main reason being due to the fact that the copper pyrophosphate baths have better throwing power, particularly in their ability to plate in the holes of the printed circuit board. The copper fluoborate baths previously proposed, i.e., 150 to 450 grams per liter copper fluoborate which will provide copper in a concentration between about 40 to 120 grams per liter, and about 0.5 to 40 grams per liter fluoboric acid, were originally developed for high speed plating, where rapid build-up of copper was required. These baths have not been found acceptable in the copper plating of printed circuit boards, particularly in their inability to satisfactorily plate the circuit boards in the holes of the boards.

It has now been found that an aqueous acid copper plating bath comprising a mixture of about 5 to 35, preferably 10 to 30, grams per liter copper and 100 to 700, preferably 150 to 600, grams per liter fluoboric acid, has been found to exhibit unexpected throw power in its ability to copper plate the holes of printed circuit boards, and fill small imperfections in the board or hole surface to provide a level copper deposit. The copper plating baths of the present invention exhibit a throw power which is at least equal to the copper pyrophosphate plating baths now commercially used.

Figure 1:
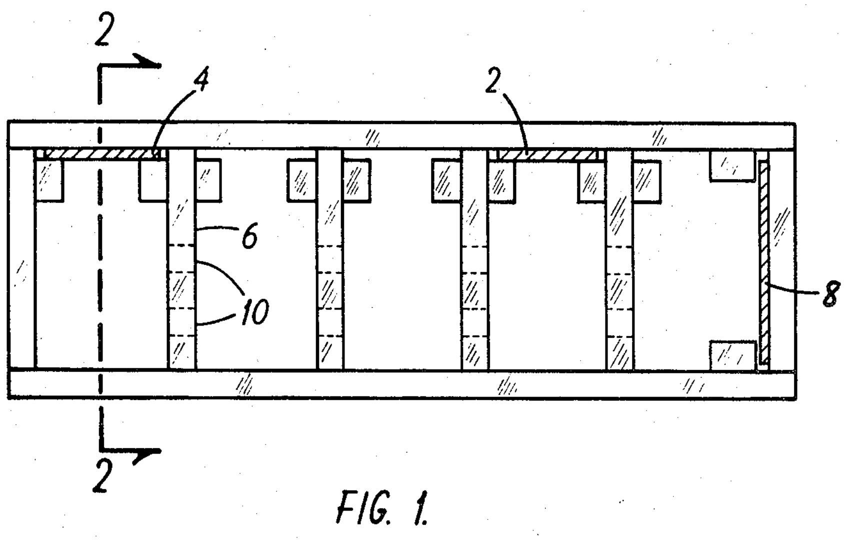
FIG. 1 is a plan view of a test cell developed to determine the throw power measurements of the copper plating baths.
Figure 2:
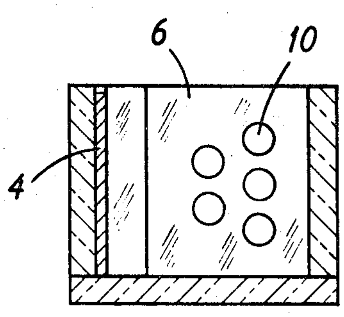
FIG. 2 is an elevational view of one of the partition walls of the test cell, through cutting plane 2—2 of FIG. 1.

The operation of the cell shown in FIG. 1 is somewhat similar in principle to the operation of the Haring-Bloom cell usually employed for throwing power measurement. However, unlike the Haring-Bloom cell, this cell is smaller in size and has a multiplicity of compartments (five are shown in FIG. 1) within which the cathodes, 2 and 4 which are to be plated, are placed against the side of the cell. The copper plating bath solution flows through the compartments through the five ¼" holes, 10, drilled into each compartment partition, 6. This partition is shown in FIG. 2. The percent "throw" is calculated by dividing the weight of the deposit of the panel (cathode, 2) closest to the anode, 8, into the weight of the deposit of the panel (cathode, 4) away from the anode. The volume of solution used in the test cell is approximately 250 milliliters. In the examples presented below, all of the throwing power determinations of the baths are tested in the above-described test cell.

The copper plating bath of the present invention may be prepared by dissolving a copper salt, preferably copper fluoborate, in an aqueous solution in amount that, upon dissolution, the copper salt supplies copper ions to the aqueous bath in a concentration from about 5 to 35 grams per liter, preferably 10 to 30 grams per liter. Fluoboric acid is added to the aqueous bath to provide a fluoboric acid concentration ranging from about 100 to 700, preferably 150 to 600, grams per liter. This may be readily accomplished by mixing a concentrate of copper fluoborate, which contains approximately 45% copper fluoborate in an aqueous solution, and fluoboric acid which is then poured directly into a plating tank and diluted with water to the desired volume. The bath composition then may be adjusted to a specific concentration of either copper ion or fluoboric acid adding either copper fluoborate to raise the copper concentration or fluoboric acid to raise the fluoboric acid concentration. After final adjustment, the solution may be clarified by treatment with activated carbon and filtrated. The recommended practice is to have an auxiliary tank where the bath solution can be treated with carbon and then filtered back into the plating tank. If an extra tank is not available, the carbon can be built up on the filter pad and the solution recirculated through the filters, allowing sufficient time to remove the solids and other contaminates. Paper pulp or similar filter aids can be used. While mechanical agitation is not necessary, it can be advantageously employed in the form of a moving work rod or motor driven agitator. The use of agitation permits plating at higher current densities and the agitation of the bath solution facilitates the solution being passed through the holes punched in the printed circuit board which aids in the deposition of the copper in these holes.

The operating temperature of the aqueous acid copper bath solution of the present invention may be varied from approximately the freezing temperature of the bath solution, i.e., about −58° F., up to as high as about 170° F. However, the recommended operating temperatures range from about 50° F. to 120° F., the upper operating temperature being dictated by the decomposition temperature of the bath, the softening point of the plastic base substrate of the printed circuit board employed, and the type of resist used.

The permissible current density will vary widely, depending on the bath temperature, the degree of agitation employed, and the amount of copper and acid concentration. In general, it is possible to use current density ranging from about 5 to 350 amps. per sq. ft., preferably between 10 to 150 amps. per sq. ft., with current densities below about 100 amps. per sq. ft. being recommended. In practice, current densities from about 10 to 100 amperes per sq. ft., unagitated, are recommended, although higher current densities up to about 350 amperes per sq. ft. can be employed with agitation. Furthermore, the shape and size of the article to be plated can have an important effect on the maximum allowable current densities.

The anodes employed in the copper plating bath of the present invention may be either roller annealed or electrolytic copper anodes, with the effective anode area approximately equal to the cathode area. Should the formation of a reddish brown powder on the anodes be observed during the plating operation, a condition common to acid copper baths, it may be desired to bag the anode in a material which will aid in maintaining a clear bath, e.g., Vinyon or Dynel, and thereby require less frequent filtration. This will be necessary when the bath solution is agitated, since the powder would be swept from the anode and becomes suspended in the plating solution, often resulting in rough nodular deposits on the cathode.

As mentioned above, the copper baths of the present invention have been found to exhibit good throwing power and the property of forming smooth, level, ductile copper deposits without the need of employing addition agents in the bath compositions. This is unexpected because the usual copper plating bath compositions of the prior art require the addition of organic and inorganic agents to achieve a high throw power, good leveling, an absence of pores, and a ductile copper plate. However, if desired, brightening agents may be added without adversely affecting the plating bath composition of the present invention.

Surprisingly, these results are achieved by the copper plating baths of the present invention with the discovery of a combination of the lowering of the copper ion concentration with a concomitant increase in the fluoboric acid concentration. With the copper plating bath of the present invention the copper plating of printed circuit boards is obtained in a simple operation which may be carried out at relatively low temperatures and current densities.

EXAMPLE I

A series of copper plating bath solutions were prepared for determining their throwing power. The throwing power of each of these baths was determined in the cell described above and shown in FIG. 1, and the throw power expressed in percent was calculated by dividing the weight of copper deposit on the cathode (brass panel) closest to anode into the weight of the deposit on the cathode (brass panel) furthest from the anode. The volume of copper plating bath solution employed for each run was 250 mls. The concentrations of the baths, the current densities employed and the throwing power of each of these copper plating baths are presented in Table I, below. The plating bath solutions were prepared by mixing copper fluoborate with a 46% fluoboric acid solution in amounts sufficient to give upon dilution with water the indicated concentrations of copper ion and fluoboric acid.

TABLE I

| Run No. | Copper, grams/ liter | Fluoboric acid, grams/ liter | Current density, amps/ sq. ft. | Time, minutes | Throw power, percent | Remarks |
|---|---|---|---|---|---|---|
| 1 | 11 | 3 | 30 | 15 | 22.0 | |
| 1 (A) | 11 | 102 | 25 | 15 | 48.8 | |
| 2 | 11 | 170 | 25 | 15 | 48.1 | |
| 3 | 11 | 170 | 20 | 15 | 46.8 | |
| 4 | 11 | 270 | 25 | 15 | 53.5 | |
| 5 | 11 | 340 | 20 | 15 | 52.5 | |
| 6 | 15 | 4 | 15 | 15 | 21.3 | |
| 7 | 15 | 170 | 20 | 15 | 36.0 | |
| 8 | 15 | 170 | 25 | 15 | 41.0 | |
| 9 | 15 | 225 | 20 | 15 | 38.1 | |
| 10 | 15 | 225 | 25 | 15 | 44.3 | |
| 11 | 15 | 340 | 20 | 15 | 40.8 | |
| 12 | 15 | 340 | 25 | 15 | 45.5 | |
| 13 | 15 | 450 | 20 | 15 | 43.3 | |
| 14 | 15 | 450 | 25 | 15 | 53.6 | |
| 15 | 15 | 620 | 15 | 15 | 42.8 | |
| 16 | 20 | 340 | 10 | 15 | 29.5 | |
| 17 | 20 | 340 | 20 | 15 | 32.0 | |
| 18 | 20 | 340 | 30 | 15 | 35.0 | |
| 19 | 30 | 8 | 30 | 15 | 21.2 | |
| 20 | 30 | 170 | 30 | 15 | 26.5 | |
| 21 | 30 | 340 | 30 | 15 | 28.4 | |
| 22 | 30 | 565 | 30 | 15 | 29.5 | |

See Note (A) at end of Table II.

EXAMPLE II

Another series of plating baths were prepared by the procedure of Example I, except that the copper plating baths employed contained copper in amounts which were outside the concentration of copper employed in the plating baths of the present invention. The cell described in Example I was employed. The bath composition, concentration, current densities and throwing power are presented in Table II, below.

TABLE II

| Run No. | Copper, grams/ liter | Fluoboric acid, grams/ liter | Current density, amps/ sq. ft. | Time, minutes | Throw power, percent | Remarks |
|---|---|---|---|---|---|---|
| 23 | 45 | 11 | 40 | 10 | 20.6 | |
| 24 | 45 | 170 | 20 | 15 | 26.4 | |
| 25 | 45 | 170 | 40 | 10 | 23.1 | |
| 26 | 45 | 170 | 50 | 10 | 24.4 | |
| 27 | 45 | 340 | 20 | 15 | 25.4 | |
| 28 | 45 | 340 | 40 | 10 | 25.6 | |
| 29 | 45 | 510 | 40 | 10 | 22.0 | |
| 30 | 60 | 15 | 40 | 10 | 22.0 | See footnote A. |
| 31 | 60 | 15 | 50 | 10 | 20.8 | See footnote A. |
| 32 | 60 | 170 | 50 | 10 | 23.5 | |
| 33 | 60 | 225 | 40 | 10 | 24.3 | |
| 34 | 60 | 340 | 50 | 10 | 23.0 | |
| 35 | 60 | 410 | 50 | 10 | 24.2 | |
| 36 | 90 | 23 | 20 | 15 | 21.4 | |
| 37 | 90 | 340 | 20 | 15 | 22.7 | |
| 38 | 90 | 340 | 40 | 10 | 21.9 | |
| 39 | 22 | ---------- | 10 | 10 | 43 | See footnote B. |

NOTE.—A=Presently recommended commercial copper fluoborate bath composition for plating printed circuits. B=Commercial copper pyrophosphate bath.

EXAMPLE III

A series of copper plating baths were prepared in which were added various concentrations of boric acid to ascertain what, if any, effect it would have on the throwing power of the copper fluoborate baths of the present invention. The bath compositions, concentration of ingredients, current densities employed, and throwing power obtained are presented in Table III, below. The cell described in Example I was employed.

TABLE III

| Run No. | Copper, grams/ liter | Fluoboric acid, grams/ liter | Boric acid, grams/ liter | Current density, amps/ sq. ft. | Time, minutes | Throw power percent |
|---|---|---|---|---|---|---|
| 40 | 12 | 3 | 40 | 20 | 15 | 22.0 |
| 41 | 12 | 68 | 44 | 20 | 15 | 31.0 |
| 42 | 12 | 240 | 4 | 20 | 15 | 46.0 |
| 43 | 12 | 240 | 14 | 20 | 15 | 47.4 |
| 44 | 12 | 240 | 34 | 20 | 15 | 47.2 |
| 45 | 15 | 240 | 14 | 20 | 15 | 36.4 |
| 46 | 15 | 240 | 34 | 20 | 15 | 39.2 |
| 47 | 15 | 410 | 2 | 25 | 15 | 43.4 |
| 48 | 15 | 410 | 4 | 25 | 15 | 46.5 |
| 49 | 20 | 340 | 28 | 20 | 15 | 33.5 |

From these data it can be observed that the boric acid has substantially no effect on the throwing power of the copper fluoborate baths of the present invention.

EXAMPLE IV

A copper fluoborate plating bath composition was prepared which contained 15 grams per liter copper and 340 grams per liter fluoboric acid. A series of 5 inch by 7 inch printed circuit boards, 0.063 inch thick, and having holes 0.04 inch in diameter were plated in a commercial plating tank. The current density employed was 45 amps per square foot for 30 minutes. This plating operation was conducted at room temperature. Mild air agitation was employed. The copper deposit plated in the holes of the circuit boards was approximately 1 mil (0.001 inch) thick. The board to hole ratios for this bath ranged from 1:1 to 1.25:1. Operating under the same conditions commercial copper pyrophosphate baths exhibited board to hole ratio ranging from 1.1:1 to 1.3:1. Thus, the copper fluoborate plating bath composition of the present invention is at least as good as a copper pyrophosphate bath for plating in the holes of a printed circuit board as a commercial copper pyrophosphate plating bath.

EXAMPLE V

The ductility of the copper plated on a printed circuit board, prepared in Example IV employing a plating bath comprising 15 grams per liter of copper and 340 grams per liter fluoboric acid, was determined by a thermal shock method. This test comprises immersing the copper plated printed circuit wiring board for 10 seconds in a molten solder bath (500° F.) comprising a mixture of 60 parts by weight tin and 40 parts by weight lead. The copper plated printed circuit board was then sectioned below the solder and the copper plate examined under 400 power magnification, particularly in the area of the copper deposited in the holes near the flat surface of the board where stress is prevalent. The copper plate was observed to have no cracks in the holes indicating that the copper plate was ductile. These same results were obtained employing the same copper plating bath, but varying the current densities between 20 and 60 amps per square foot.

EXAMPLE VI

Tensile and elongation tests were run on copper deposited on a stainless steel panel. The copper deposit had a thickness of 0.0035 inch (3.5 mils). The bath composition comprised 12 grams per liter copper and 340 grams per liter fluoboric acid. The bath temperature was maintained at 85° F. and the curent density was 30 amps per square foot. Mechanical agitation was employed. The elongation of the copper stripped from the stainless steel panels (over 2 inch span) measured 15.5% and the tensile strength (p.s.i.) was 29,000.

I claim:

1. A method of producing a uniformly smooth, ductile copper coating on a printed circuit board containing perforations comprising the steps of electrodepositing copper on said substrate from an acidic aqueous copper plating bath containing copper in a concentration from 5 to 35 grams per liter and free fluoboric acid in a concentration from 100 to 700 grams per liter.

2. The method of claim 1 wherein the copper deposited on the printed circuit board has a board to hole ratio of 1:1 to 1.25:1.

3. The method of claim 1 wherein the copper concentration is from 10 to 30 grams per liter.

4. The method of claim 1 wherein the fluoboric acid concentration is from 150 to 650 grams per liter.

5. The method of claim 1 wherein the electrodeposition of copper on the substrate is effected at a bath temperature ranging from about −58° F. up to about 170° F. with current densities ranging from about 5 to 350 amps per square foot.

References Cited

UNITED STATES PATENTS

| | | | |
|---|---|---|---|
| 3,119,754 | 1/1964 | Blumenfeld et al. | |
| 2,897,409 | 7/1959 | Gitto | 204—24X |

OTHER REFERENCES

Struyk, Clifford et al.: Monthly Revue, American Electroplaters' Society, 33, 923–934 (1946).

Haring, H. E. et al.: Transactions of the American Electrochemical Society, vol. 44, pp. 313, 314 and 336 (1923).

GERALD L. KAPLAN, Primary Examiner

U.S. Cl. X.R.

204—52